(12) United States Patent
Guo et al.

(10) Patent No.: US 12,550,444 B2
(45) Date of Patent: Feb. 10, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Tao Guo, Wuhan (CN); Cheng Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/029,216

(22) PCT Filed: Mar. 23, 2023

(86) PCT No.: PCT/CN2023/083466
§ 371 (c)(1),
(2) Date: Mar. 29, 2023

(87) PCT Pub. No.: WO2024/011951
PCT Pub. Date: Jan. 18, 2024

(65) Prior Publication Data
US 2024/0355827 A1 Oct. 24, 2024

(30) Foreign Application Priority Data
Jul. 15, 2022 (CN) .......................... 202210837483.5

(51) Int. Cl.
H01L 27/12 (2006.01)
H10D 86/40 (2025.01)
(Continued)

(52) U.S. Cl.
CPC ........... *H10D 86/60* (2025.01); *H10D 86/411* (2025.01); *H10D 86/441* (2025.01); *H10K 59/126* (2023.02); *H10K 59/131* (2023.02)

(58) Field of Classification Search
None
See application file for complete search history.

(56) References Cited

U.S. PATENT DOCUMENTS

2024/0046861 A1* 2/2024 Wang .................. H10K 59/126

FOREIGN PATENT DOCUMENTS

| CN | 112909085 A | 6/2021 |
|----|-------------|--------|
| CN | 113327936 A | 8/2021 |

(Continued)

OTHER PUBLICATIONS

PCT International Search Report for International Application No. PCT/CN2023/083466, mailed on Jun. 3, 2023, 7pp.

(Continued)

*Primary Examiner* — William C Trapanese
(74) *Attorney, Agent, or Firm* — The Roy Gross Law Firm, LLC; Roy D. Gross

(57) ABSTRACT

The present invention relates to a display panel and a display device. The present invention uses the first shielding portion to shield the electrical field formed by the non-overlapping charge centers of positive and negative ions inside the substrate and the electrical field formed at the interface of different membrane layers, prevents the electrical field from affecting the operating characteristics of the second semiconductor layer, avoiding the phenomenon of afterimage and ESD explosion damage. At the same time, it avoids the problems of poor electrostatic shielding effect of the lower gate electrode and the hump effect and reduction in reliability of the lower channel in conventional technology IGZO TFT.

18 Claims, 6 Drawing Sheets

(51) Int. Cl.
*H10D 86/60* (2025.01)
*H10K 59/126* (2023.01)
*H10K 59/131* (2023.01)

(56) References Cited

FOREIGN PATENT DOCUMENTS

| | | | | |
|---|---|---|---|---|
| CN | 113593478 | A | * 11/2021 | ........... G09G 3/3208 |
| CN | 113690306 | A | 11/2021 | |
| CN | 113745253 | A | 12/2021 | |
| CN | 113921574 | A | 1/2022 | |
| CN | 114361185 | A | 4/2022 | |
| CN | 15207001 | A | 10/2022 | |

OTHER PUBLICATIONS

PCT Written Opinion of the International Searching Authority for International Application No. PCT/CN2023/083466, mailed on Jun. 3, 2023, 9pp.
Chinese Office Action issued in corresponding Chinese Patent Application No. 202210837483.5 dated Feb. 26, 2025, pp. 1-7.

* cited by examiner

DISPLAY PANEL AND DISPLAY DEVICE

CROSS REFERENCE TO RELATED APPLICATIONS

This application is a National Phase of PCT Patent Application No. PCT/CN2023/083466 having International filing date of Mar. 23, 2023, which claims the benefit of priority of Chinese Patent Application No. 202210837483.5, filed Jul. 15, 2022, the contents of which are all incorporated herein by reference in their entirety.

FIELD OF INVENTION

The present application relates to a field of display technologies, especially to a display panel and a display device.

BACKGROUND OF INVENTION

A low temperature poly-oxide thin film transistor (LTPO TFT) technology is an emerging thin film transistor technology in recent years. In the field of display panels, a LTPO substrate can adopt a combination of a low-temperature poly-silicon thin film transistor (LTPS TFT) and an oxide semiconductor thin film transistor (indium gallium zinc oxide TFT, IGZO TFT) on a substrate as a pixel driver circuit.

TECHNICAL ISSUE

Non-coincidence of the charge center of the positive and negative ions within the substrate easily creates an electrical field, i.e., a polarization effect that forms an electrical field. Moreover, the presence of charges at the interface of different membrane layers will also form an electrical field. The aforementioned electrical field will affect the operating characteristics of the thin film transistor, causing the working current to shift, ultimately leading to a voltage difference at the two ends of the light-emitting layer of the display panel, resulting in differences in the display brightness of each frame and the occurrence of afterimage problems. When the aforementioned electrical field is large enough, these charges will break through the screen of the display panel, i.e., the screen ESD blasting phenomenon. Furthermore, during the preparation of the display panel, the process of peeling and sticking the film is very prone to static electricity, and this static electrical field is also very strong, which can cause the screen to break down, i.e., ESD blasting.

To solve these issues, metal shielding layers (back shielding metal, BSM) are generally prepared on the back of the LTPS TFT, and the IGZO TFT is set to a dual-gate structure with upper and lower gate electrodes, where the lower gate electrode can function similarly to the BSM shielding function, thereby shielding the electrical characteristic drift caused by the charge on the thin film transistor. However, setting the IGZO TFT to a dual-gate structure has many defects, such as the limited width of the lower gate electrode in the IGZO TFT, which cannot achieve the large-area shielding of the BSM and has limited effectiveness in shielding static electricity. Premature opening of the lower channel easily leads to the hump effect. External bias, temperature, and light will simultaneously affect the upper and lower channels, causing the IdVg transfer characteristic curve of the IGZO TFT to shift, leading to a reduction in the reliability of the IGZO TFT.

SUMMARY OF INVENTION

Technical Solution

An objective of the present invention is to provide a display panel and a display device that can solve an issue of a poor electrostatic shielding effect of the lower gate electrode of an IGZO TFT in a conventional technology and premature opening of a lower channel of the IGZO TFT easily leads to the hump effect and reduction in the reliability.

To solve the above issue, the present invention provides a display panel comprising: a substrate; a first semiconductor layer disposed on a side of the substrate; a second semiconductor layer disposed on a side of the first semiconductor layer away from the substrate, wherein material of the second semiconductor layer comprises metal oxide; a first metal layer disposed on a side of the second semiconductor layer away from the substrate, wherein the first metal layer comprises a first gate electrode disposed to correspond to the second semiconductor layer; and a second metal layer disposed between the second semiconductor layer and the substrate, wherein the second metal layer comprises a first shielding portion disposed opposite to the second semiconductor layer, and the first shielding portion is fed to a first constant electric potential.

Furthermore, the display panel further comprises: a third metal layer disposed between the first semiconductor layer and the substrate, wherein the third metal layer comprises a second shielding portion disposed opposite to the first semiconductor layer, and the second shielding portion is electrically connected to a second constant electric potential.

Furthermore, the display panel comprises: a display region and a non-display region surrounding the display region; the display panel further comprises: a fourth metal layer disposed on a side of the first metal layer away from the substrate, wherein the fourth metal layer comprises a first wiring disposed in the display region and the non-display region to conduct the first constant electric potential; wherein the first shielding portion is electrically connected to the first wiring through a first via hole in the display region.

Furthermore, the fourth metal layer further comprises a second wiring disposed in the non-display region to conduct the second constant electric potential; wherein the third metal layer comprises a plurality of second shielding portions disposed in the display region, adjacent ones of the second shielding portions are electrically connected to each other, and the second shielding portions are electrically connected to the second wiring through second via holes.

Furthermore, the display panel further comprises: a fifth metal layer disposed between the first semiconductor layer and the second semiconductor layer, wherein the fifth metal layer comprises a second gate electrode and a first capacitor electrode plate disposed to correspond to the first semiconductor layer; and a sixth metal layer disposed between the fifth metal layer and the second semiconductor layer, wherein the sixth metal layer further comprises a second capacitor electrode plate disposed to correspond to the first capacitor electrode plate.

Furthermore, the second metal layer and the fifth metal layer or the sixth metal layer are disposed in the same layer.

Furthermore, the third metal layer and the second metal layer are disposed in the same layer, and the first shielding portion is electrically connected to an adjacent one of the second shielding portions.

Furthermore, each of the first constant electric potential and the second constant electric potential are supplied from a high voltage power line.

Furthermore, the display panel further comprises: a first thin film transistor, a second thin film transistor, a third thin film transistor, a fourth thin film transistor, a fifth thin film transistor, a sixth thin film transistor, a seventh thin film transistor, a first scan line, a second scan line, a third scan line, a fourth scan line; a data line, and a first light emitting control signal line; and the reset signal line comprises a first reset signal line and a second reset signal line; a source electrode of the first thin film transistor is electrically connected to the high voltage power line, and a drain electrode of the first thin film transistor is electrically connected to the low voltage power line; a source electrode of the second thin film transistor is electrically connected to a source electrode of the first thin film transistor, a drain electrode of the second thin film transistor is electrically connected to the data line, and a gate electrode drain electrode of the second thin film transistor is electrically connected to the first scan line; a source electrode of the third thin film transistor is electrically connected to a first drain electrode of the first thin film transistor, a drain electrode of the third thin film transistor is electrically connected to the gate electrode of the first thin film transistor, and a gate electrode of the third thin film transistor is electrically connected to the second scan line; a source electrode of the fourth thin film transistor is electrically connected to the gate electrode of the first thin film transistor, a drain electrode of the fourth thin film transistor is electrically connected to the first reset signal line, and a gate electrode of the fourth thin film transistor is electrically connected to the third scan line; a gate electrode of the fifth thin film transistor is electrically connected to the first light emitting control signal line, a source electrode of the fifth thin film transistor is electrically connected to a source electrode of the first thin film transistor, and a drain electrode of the fifth thin film transistor is electrically connected to the high power voltage line; a gate electrode of the sixth thin film transistor is electrically connected to the first light emitting control signal line, a source electrode of the sixth thin film transistor is electrically connected to a drain electrode of the first thin film transistor, and a drain electrode of the sixth thin film transistor is electrically connected to the low power voltage line; a source electrode of the seventh thin film transistor is electrically connected to a drain electrode of the sixth thin film transistor, a drain electrode of the seventh thin film transistor is electrically connected to the second reset signal line, and a gate electrode of the seventh thin film transistor is electrically connected to the fourth scan line; a first end of the storage capacitor is electrically connected to a gate electrode of the first thin film transistor, and a second end of the storage capacitor is electrically connected to a drain electrode of the fifth thin film transistor; wherein the third thin film transistor comprises the first shielding portion, the first shielding portion is electrically connected to the first constant electric potential; wherein the fourth thin film transistor comprises the first shielding portion, the first shielding portion is electrically connected to the first constant electric potential; and wherein the first thin film transistor comprises the second shielding portions, the second shielding portions are electrically connected to the second constant electric potential.

Furthermore, each of the third thin film transistor and the fourth thin film transistor comprises the second semiconductor layer, and material of the second semiconductor layer comprises metal oxide; and the first thin film transistor comprises the first semiconductor layer, material of the first semiconductor layer comprises a low-temperature polysilicon semiconductor.

Advantages

Compared to the conventional technology, the second metal layer of the present invention includes a first shielding portion corresponding to the second semiconductor layer, which is electrically connected to a first constant electric potential. By using the first shielding portion, the electrical field formed by the non-overlapping charge centers of positive and negative ions inside the substrate and the electrical field formed at the interface of different membrane layers can be shielded, thus avoiding the impact of the electrical field on the operating characteristics of the second semiconductor layer, and preventing the occurrence of afterimage and ESD damage phenomena. Also, it avoids the poor electrostatic shielding effect of the lower gate electrode in the conventional IGZO TFT technology, which easily causes premature opening of the lower channel and leads to problems such as the hump effect and reduced reliability.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

Figure 1:
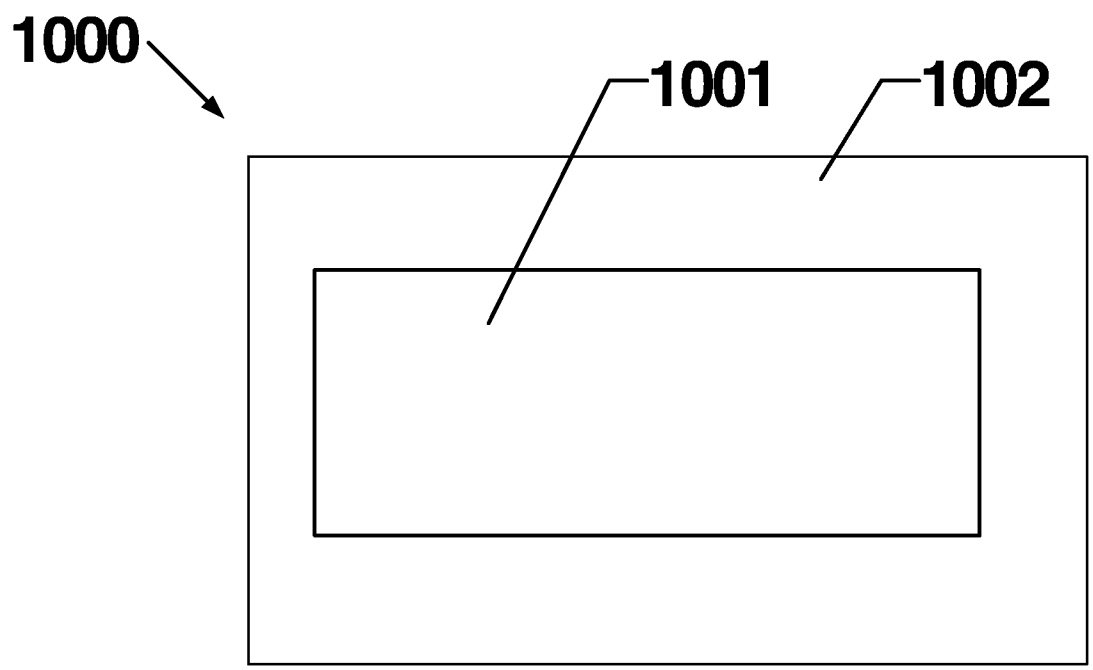
FIG. 1 is a plane schematic view of a display panel of a first embodiment of the present invention.

INDICATION OF REFERENCE NUMERALS OF THE ATTACHED DRAWINGS 1000, display panel; 1001, display region;
1002, non-display region;
100, thin film transistor device layer; 200, light emitting layer;
300, substrate;
201, anode; 202, hole injection layer;
203, hole transport layer; 204, light emitting material layer;
205, electron transport layer; 206, electron injection layer;
207, cathode;
101, second metal layer; 102, buffer layer;
103, first semiconductor layer; 104, first insulation layer;
105, fifth metal layer; 106, second insulation layer;

107, sixth metal layer; 108, first interlayer insulation layer;
109, second semiconductor layer; 110, third insulation layer;
111, first metal layer; 112, second interlayer insulation layer;
113, first source electrode; 114, first drain electrode;
115, second source electrode; 116, second drain electrode;
117, first planarization layer; 118, fourth metal layer;
119, second planarization layer; 120, third metal layer;
1011, first shielding portion; 121, second shielding portions;
1051, second gate electrode; 1052, first capacitor electrode plate;
1111, first gate electrode; 1071, second capacitor electrode plate;
1181, first wiring; and 1182, conductive unit.

DETAILED DESCRIPTION OF PREFERRED EMBODIMENTS

Preferred embodiments of the present invention are described with accompanying drawings as follows introduce a person of ordinary skill in the art the technical contents of the present invention completely such that examples are used to prove that the present invention can be embodied. As such the published technologies of the present invention are made clearer such that a person of ordinary skill in the art can better understand the way to embody the present invention. However, the present invention can be embodied by embodiments of various forms, and the protective scope of the present invention is not only limited in the mentioned embodiment herein, and explanation of the following embodiments is not for limiting the scope of the present invention.

The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention.

In the drawings, elements with the same structures are indicated with the same numerals, and elements with similar structures or functions are indicated with similar numerals. Furthermore, for convenience of understanding and description, the dimension and thickness of each assembly in the drawings are depicted at arbitrarily, and the present invention has no limit to the dimension and thickness of each assembly.

First Embodiment

The present embodiment provides a display device, the display device comprises cell phone, computer, MP3, MP4, tablet, television, or digital camera. The display device comprises a display panel 1000.

With reference to FIG. 1, the display panel 1000 comprises a display region 1001 and a non-display region 1002 surrounding the display region 1001.

Figure 2:
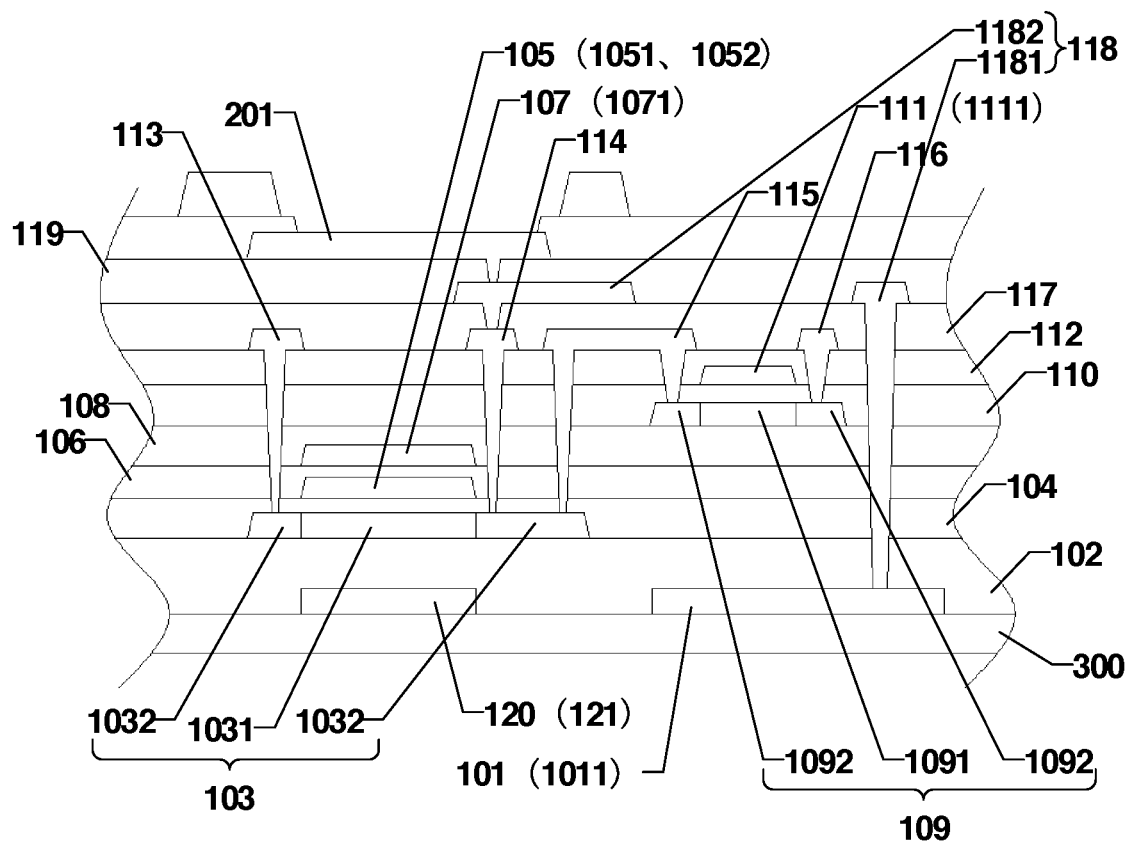
FIG. 2 is a schematic structural view of the display panel of the first embodiment of the present invention.
Figure 4:
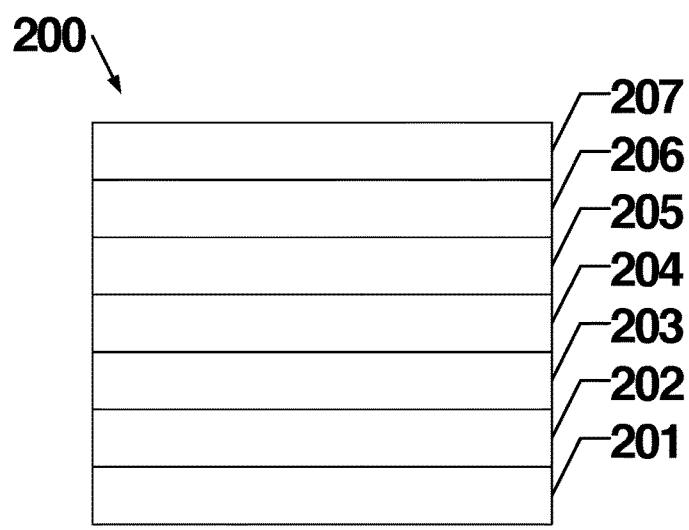
FIG. 4 is a schematic structural view of a light emitting layer of the first embodiment of the present invention.

With reference to FIGS. 2 and 4, the display panel 1000 located in the display region 1001 comprises: a thin film transistor device layer 100, a light emitting layer 200 and a substrate 300.

Material of the substrate 300 comprises polyimide, polycarbonate, polyethylene terephthalate, and polyethylene naphthalate. As such, the substrate 300 has better impact resistance and can effectively protect the display panel 1000.

The thin film transistor device layer 100 comprises: a first semiconductor layer 103, a second semiconductor layer 109, a first metal layer 111, a second metal layer 101, a third metal layer 120, a fourth metal layer 118, a fifth metal layer 105, a sixth metal layer 107, a buffer layer 102, a first insulation layer 104, a second insulation layer 106, a first interlayer insulation layer 108, a third insulation layer 110, a second interlayer insulation layer 112, a first source electrode 113, a first drain electrode 114, a second source electrode 115, a second drain electrode 116, a first planarization layer 117, and a second planarization layer 119.

The third metal layer 120 is disposed on a side of the substrate 300. The third metal layer 120 is disposed between the first semiconductor layer 103 and the substrate 300. The third metal layer 120 comprises a second shielding portions 121 disposed to correspond to the first semiconductor layer 103, and the second shielding portions 121 is electrically connected to a second constant electric potential. The third metal layer 120 comprises a plurality of second shielding portions 121 disposed in the display region 1001, and adjacent ones of the second shielding portions 121 are electrically connected to each other. In the present embodiment, the second constant electric potential is a high voltage power line. Material of the third metal layer 120 is conductive metal, for example, titanium, molybdenum, aluminum, copper, nickel, etc.

The present embodiment utilizes the second shielding portions 121 to shield the electrical field formed by the non-coincidence of the centers of positive and negative ion charges inside the substrate 300 and the electrical field formed at the interface of different film layers, thereby avoiding the impact of such electrical fields on the operating characteristics of the first semiconductor layer 103 and preventing the occurrence of afterimage and ESD explosion damage.

The buffer layer 102 covers a side of the second shielding portions 121 away from the substrate 300 and extends and covers the substrate 300. The buffer layer 102 mainly performs a cushion function, and material thereof can be SiOx, SiNx, SiNOx, or a combination structure of SiNx and SiOx.

The first semiconductor layer 103 is disposed on a side of the buffer layer 102 away from the substrate 300. The first semiconductor layer 103 comprises a first channel portion 1031 and a first conductive portion 1032 located at two ends of the first channel portion 1031.

The first insulation layer 104 is disposed on a side of the first semiconductor layer 103 away from the substrate 300 and extends and covers the buffer layer 102. The first insulation layer 104 is mainly configured to prevent the first semiconductor layer 103 from contacting the fifth metal layer 105 and causing a shorting phenomenon. Material of the first insulation layer 104 can be SiOx, SiNx, $Al_2O_3$ or a combination structure of SiNx and SiOx, or a combination structure of SiOx, SiNx, and SiOx.

The fifth metal layer 105 is disposed on a side of the first insulation layer 104 away from the substrate 300. The fifth metal layer 105 is disposed between the first semiconductor layer 103 and the second semiconductor layer 109. The fifth metal layer 105 comprises a second gate electrode 1051 and a first capacitor electrode plate 1052 disposed to correspond to the first semiconductor layer 103. The second gate electrode 1051 is disposed on a side of the first insulation layer 104 away from the substrate 300 and is disposed to correspond to the first channel portion 1031 of the first semiconductor layer 103. Material of the second gate electrode 1051 can be Mo, a combination structure of Mo and Al, a combination structure of Mo and Cu, a combination structure of Mo, Cu, and IZO, a combination structure of IZO, Cu, and IZO, a combination structure of Mo, Cu, and ITO, a combination structure of Ni, Cu, and Ni, a combination structure of MoTiNi, Cu, and MoTiNi, a combination structure of NiCr, Cu, and NiCr, or CuNb.

The second insulation layer 106 is disposed on a side of the fifth metal layer 105 away from the substrate 300 and extends and covers the first insulation layer 104. The second insulation layer 106 is mainly configured to prevent the fifth metal layer 105 from contacting the sixth metal layer 107 and causing a shorting phenomenon. Material of the second insulation layer 106 can be SiOx, SiNx, $Al_2O_3$ or a combination structure of SiNx and SiOx, or a combination structure of SiOx, SiNx, and SiOx.

The sixth metal layer 107 is disposed on a side of the second insulation layer 106 away from the substrate 300. The sixth metal layer 107 is disposed between the fifth metal layer 105 and the second semiconductor layer 109. The sixth metal layer 107 further comprises a second capacitor electrode plate 1071 disposed to correspond to the first capacitor electrode plate 1052. The second capacitor electrode plate 1071 is disposed on a side of the second insulation layer 106 away from the substrate 300 and is disposed to correspond to the first capacitor electrode plate 1052. The second capacitor electrode plate 1071 is configured to couple with the first capacitor electrode plate 1052 to form the storage capacitor Cst. Material of the second capacitor electrode plate 1071 can be Mo, a combination structure of Mo and Al, a combination structure of Mo and Cu, a combination structure of Mo, Cu, and IZO, a combination structure of IZO, Cu, and IZO, a combination structure of Mo, Cu, and ITO, a combination structure of Ni, Cu, and Ni, a combination structure of MoTiNi, Cu, and MoTiNi, a combination structure of NiCr, Cu, and NiCr, or CuNb.

The first interlayer insulation layer 108 is disposed on a side of the sixth metal layer 107 away from the substrate 300 and extends and covers the second insulation layer 106. Material of the first interlayer insulation layer 108 can be SiOx, SiNx, or SiNOx.

The second semiconductor layer 109 is disposed on a side of the first interlayer insulation layer 108 away from the substrate 300. Material of the second semiconductor layer 109 comprises metal oxide. In the present embodiment, material of the second semiconductor layer 109 is IGZO. The second semiconductor layer 109 comprises a second channel portion 1091 and a second conductive portion 1092 located at two ends of the second channel portion 1091.

The third insulation layer 110 is disposed on a side of the second semiconductor layer 109 away from the substrate 300 and extends and covers the first interlayer insulation layer 108. The third insulation layer 110 is mainly configured to prevent the second semiconductor layer 109 from contacting the first metal layer 111 and causing a shorting phenomenon. Material of the third insulation layer 110 can be SiOx, SiNx, $Al_2O_3$, a combination structure of SiNx and SiOx, or a combination structure of SiOx, SiNx, and SiOx.

The first metal layer 111 is disposed on a side of the second semiconductor layer 109 away from the substrate 300. The first metal layer 111 comprises a first gate electrode 1111 disposed to correspond to the second semiconductor layer 109. The first gate electrode 1111 is disposed on a side of the third insulation layer 110 away from the substrate 300 and is disposed to correspond to the second channel portion 1091 of the second semiconductor layer 109. Material of the first gate electrode 1111 can be Mo or a combination structure of Mo and Al, a combination structure of Mo and Cu, a combination structure of Mo, Cu, and IZO, a combination structure of IZO, Cu, and IZO, a combination structure of Mo, Cu, and ITO, a combination structure of Ni, Cu, and Ni, a combination structure of MoTiNi, Cu, and MoTiNi, a combination structure of NiCr, Cu, and NiCr, or CuNb.

The second interlayer insulation layer 112 is disposed on a side of the first metal layer 111 away from the substrate 300 and extends and covers the third insulation layer 110. The second interlayer insulation layer 112 is mainly configured to prevent the first metal layer 111 from contacting a third source electrode 115, a third drain electrode 116 and causing a shorting phenomenon. Material of the second interlayer insulation layer 112 can be SiOx, SiNx, or SiNOx.

The first source electrode 113 and the first drain electrode 114 are disposed in the same layer on a side of the second interlayer insulation layer 112 away from the substrate 101 and are electrically connected to two first conductive portions 1032 of the first semiconductor layer 103.

The third source electrode 115 and the third drain electrode 116 are disposed in the same layer on a side of the second interlayer insulation layer 112 away from the substrate 101 and are electrically connected to the second conductive portions 1092 of the second semiconductor layer 109. In the present embodiment, the first source electrode 113, the first drain electrode 114, the third source electrode 115, and the third drain electrode 116 are disposed in the same layer.

The first planarization layer 117 covers sides of the first source electrode 113, the first drain electrode 114, the third source electrode 115, and the third drain electrode 116 away from the substrate 101 and extends and covers the second interlayer insulation layer 112. Material of the first planarization layer 117 can be SiOx, SiNx, SiNOx, or a combination structure of SiNx and SiOx.

The fourth metal layer 118 is disposed on a side of the first planarization layer 117 away from the substrate 300. The fourth metal layer 118 comprises a first wiring 1181 disposed in the display region 1001 and the non-display region 1002, a second wiring (not shown in the figures) disposed in the non-display region 1002, and a conductive unit 1182.

The first wiring 1181 conducts the first constant electric potential. A first shielding portion 1011 is electrically connected to the first wiring 1181 through a first via hole in the display region 1001.

The second wiring conducts the second constant electric potential. The second shielding portions 121 are electrically connected to the second wiring through second via holes.

Figure 3:
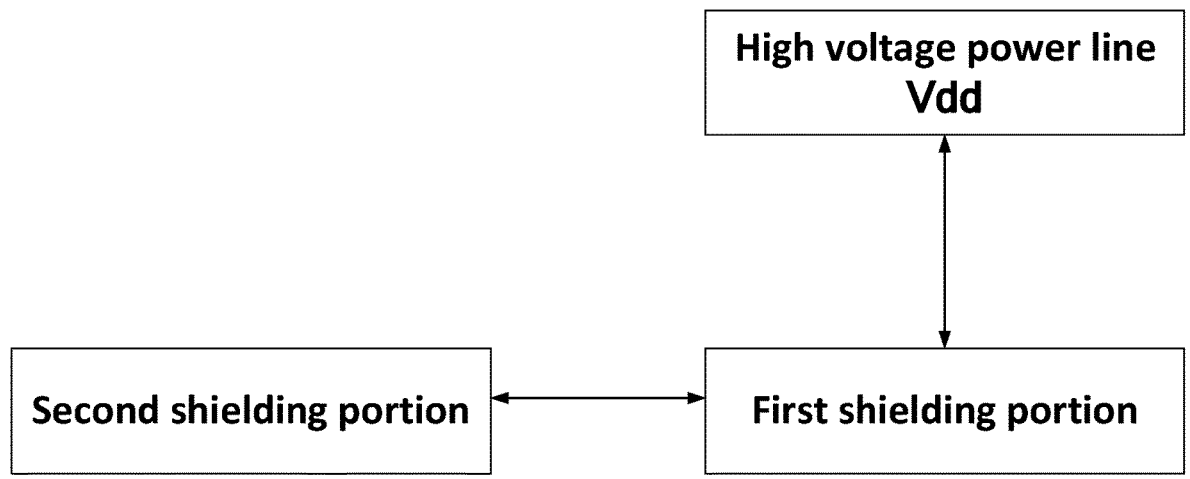
FIG. 3 is a schematic view of electrical connection of a first shielding portion, a second shielding portions, and a high voltage power line of the first embodiment of the present invention.

With reference to FIGS. 2 and 3, the present embodiment, the third metal layer 120 and the second metal layer 101 are disposed in the same layer, and the first shielding portion 1011 is electrically connected to adjacent one of the second shielding portions 121. The second shielding portions 121 and the first shielding portion 1011 has the same material, the same mask can be used to manufacture and form second shielding portions 121 and the first shielding portion 1011, which can save the mask and lower the cost.

The conductive unit 1182 is disposed on a side of the first planarization layer 117 away from the substrate 300 and is electrically connected to the first drain electrode 114. The conductive unit 1182 is mainly configured to electrically connect the first drain electrode 114 and an anode 201. Material of the conductive unit 1182 can be Mo, a combination structure of Mo and Al, a combination structure of Mo and Cu, a combination structure of Mo, Cu, and IZO, a combination structure of IZO, Cu, and IZO, a combination structure of Mo, Cu, and ITO, a combination structure of Ni, Cu, and Ni, a combination structure of MoTiNi, Cu, and MoTiNi, a combination structure NiCr, Cu, and NiCr, or CuNb.

The second planarization layer 119 covers a side of the fourth metal layer 118 away from the substrate 300 and extends and cover the first planarization layer 117. Material of the second planarization layer 119 can be SiOx, SiNx, SiNOx, or a combination structure of SiNx and SiOx.

The second metal layer 101 is disposed between the second semiconductor layer 109 and the substrate 300. The second metal layer 101 comprises the first shielding portion 1011 disposed to correspond to the second semiconductor layer 109. The first shielding portion 1011 is electrically connected to a first constant electric potential. In the present embodiment, the first constant electric potential is a high voltage power line. Material of the second metal layer 101 is conductive metal, for example, titanium, molybdenum, aluminum, copper, nickel, etc.

The present embodiment uses the first shielding portion 1011 to shield the electrical field formed by non-coincidence of the charge center of positive and negative ions within the substrate 300 and the electrical field formed on the interface of different film layers to avoid the electrical field from affecting the operating characteristics of the second semiconductor layer 109, and further avoid the phenomenon of afterimage and ESD explosion damage. Simultaneously, the present invention avoids the poor electrostatic shielding effect of the lower gate electrode in conventional technology for IGZO TFT. Furthermore, it reduces the occurrence of premature turn-on of the lower channel leading to the hump effect, and reduction of the reliability of the device. With reference to FIGS. 2 and 4, the light emitting layer 200 comprises the anode 201, a hole injection layer 202, a hole transport layer 203, a light emitting material layer 204, an electron transport layer 205, an electron injection layer 206, and a cathode 207.

The anode 201 is disposed on the thin film transistor device layer 100, and is electrically connected to the first drain electrode 114 of the thin film transistor device layer 100.

Figure 5:
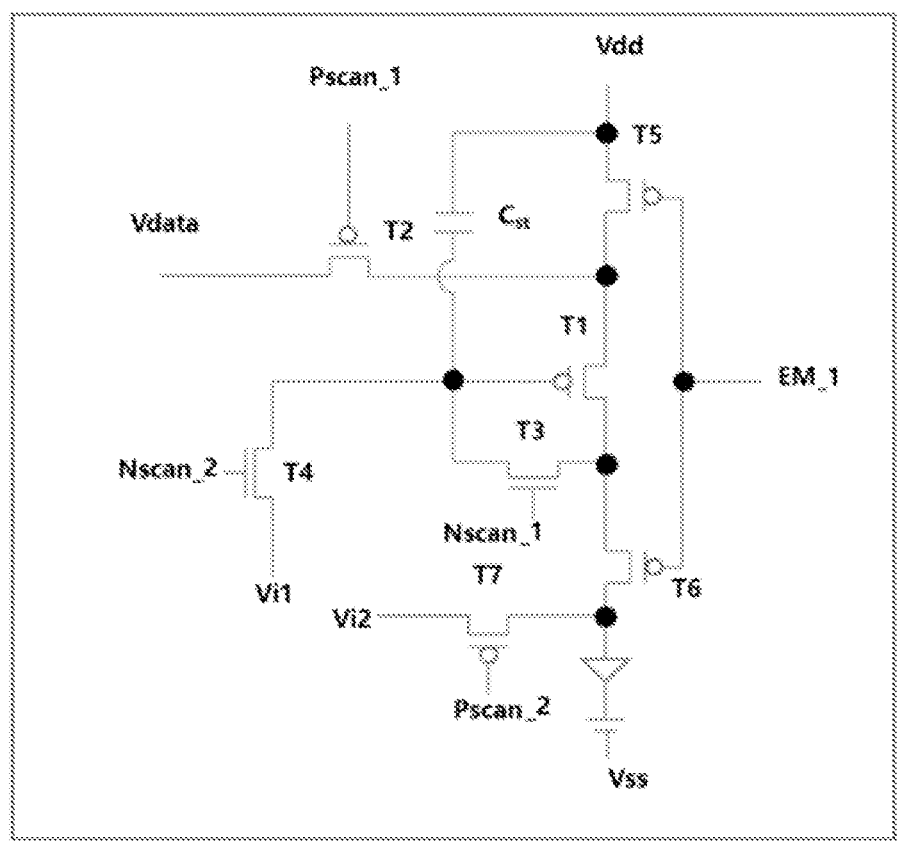
FIG. 5 is a block diagram of a pixel circuit of the first embodiment of the present invention.

With reference to FIG. 5, the display panel 1000 of the present embodiment further comprises: a first thin film transistor T1, a second thin film transistor T2, a third thin film transistor T3, a fourth thin film transistor T4, a fifth thin film transistor T5, a sixth thin film transistor T6, a seventh thin film transistor T7, a storage capacitor Cst, a first reset signal line Vi1, a second reset signal line Vi2, a first scan line Pscan-1, a second scan line Nscan-1, a third scan line Nscan-2, a fourth scan line Pscan-2, a data line Vdata, a low voltage power line Vss, a high voltage power line Vdd, and a first light emitting control signal line EM-1.

A source electrode of the first thin film transistor T1 is electrically connected to the high voltage power line Vdd, a drain electrode of the first thin film transistor T1 is electrically connected to the low voltage power line Vss. The first thin film transistor T1 comprises the first semiconductor layer 103, and material of the first semiconductor layer 103 comprises a low-temperature poly-silicon semiconductor. In the present embodiment, the first thin film transistor T1 comprises the first semiconductor layer 103, and material of the first semiconductor layer 103 is a low-temperature poly-silicon semiconductor.

A source electrode of the second thin film transistor T2 is electrically connected to the source electrode of the first thin film transistor T1, a drain electrode of the second thin film transistor T2 is electrically connected to the data line Vdata, and a gate electrode of the second thin film transistor T2 is electrically connected to the first scan line Pscan-1.

A source electrode of the third thin film transistor T3 is electrically connected to a drain electrode of the first thin film transistor T1, a drain electrode of the third thin film transistor T3 is electrically connected to a gate electrode of the first thin film transistor T1, and a gate electrode of the third thin film transistor T3 is electrically connected to the second scan line Nscan-1. The third thin film transistor T3 comprises the second semiconductor layer 109, material of the second semiconductor layer 109 comprises metal oxide. In the present embodiment, the third thin film transistor T3 comprises the second semiconductor layer 109, and material of the second semiconductor layer 109 is metal oxide.

A source electrode of the fourth thin film transistor T4 is electrically connected to the gate electrode of the first thin film transistor T1, a drain electrode of the fourth thin film transistor T4 is electrically connected to the first reset signal line Vi1, and a gate electrode of the fourth thin film transistor T4 is electrically connected to the third scan line Nscan-2. Material of a semiconductor layer of the fourth thin film transistor T4 is metal oxide. The fourth thin film transistor T4 comprises the second semiconductor layer 109. Material of the second semiconductor layer 109 comprises metal oxide. In the present embodiment, the fourth thin film transistor T4 comprises the second semiconductor layer 109, and material of the second semiconductor layer 109 is metal oxide.

A gate electrode of the fifth thin film transistor T5 is electrically connected to the first light emitting control signal line EM-1, a source electrode of the fifth thin film transistor T5 is electrically connected to The source electrode of the first thin film transistor T1, and a drain electrode of the fifth thin film transistor T5 is electrically connected to the high voltage power line Vdd.

A gate electrode of the sixth thin film transistor T6 is electrically connected to the first light emitting control signal line EM-1, a source electrode of the sixth thin film transistor T6 is electrically connected to the drain electrode of the first thin film transistor T1, and a drain electrode of the sixth thin film transistor T6 is electrically connected to the low voltage power line Vss.

A source electrode of the seventh thin film transistor T7 is electrically connected to a drain electrode of the sixth thin film transistor T6, a drain electrode of the seventh thin film transistor T7 is electrically connected to the second reset signal line Vi2, and a gate electrode of the seventh thin film transistor T7 is electrically connected to the fourth scan line Pscan-2.

A first end of the storage capacitor Cst is electrically connected to the gate electrode of the first thin film transistor T1, and a second end of the storage capacitor Cst is electrically connected to a drain electrode of the fifth thin film transistor T5.

The third thin film transistor T3 comprises the first shielding portion 1011, and the first shielding portion 1011 is electrically connected to the first constant electric potential. The third thin film transistor T3 utilizes the first shielding portion 1011 to shield the electrical field formed by the non-coinciding center of charges of positive and negative ions within the substrate 300 and the electrical field formed by the interface of different film layers, prevents the electrical field from affecting operating characteristics of the second semiconductor layer 109, and avoids the phenomenon of afterimage and ESD explosion damage. Also, it avoids the poor electrostatic shielding effect of the lower gate electrode in the conventional IGZO TFT technology, which easily causes premature opening of the lower channel and leads to problems such as the hump effect and reduced reliability.

The fourth thin film transistor T4 also has the first shielding portion 1011, and the first shielding portion 1011 is electrically connected to the first constant electric potential. As such, the fourth thin film transistor T4 can utilize the first shielding portion 1011 to shield the electrical field formed by the non-coinciding center of charges of positive and negative ions within the substrate 300 and the electrical field formed by the interface of different film layers, prevents the electrical field from affecting operating characteristics of the second semiconductor layer 109 of the fourth thin film transistor T4, and avoids the phenomenon of afterimage and ESD explosion damage. Also, it avoids the poor electrostatic shielding effect of the lower gate electrode in the conventional IGZO TFT technology, which easily causes premature opening of the lower channel and leads to problems such as the hump effect and reduced reliability.

The first thin film transistor T1 comprises the second shielding portions 121, and the second shielding portions 121 is electrically connected to the second constant electric potential. The first thin film transistor T1 utilizes the second shielding portions 121 to shield the electrical field formed by the non-coincidence of the centers of positive and negative ion charges inside the substrate 300 and the electrical field formed at the interface of different film layers, thereby avoiding the impact of such electrical fields on the operating characteristics of the first semiconductor layer 103 and preventing the occurrence of afterimage and ESD explosion damage.

As described, the pixel circuit of the display panel 1000 of the present embodiment can be a 7T1C circuit. In another embodiment, the pixel circuit of the display panel 1000 can also be 6T1C pixel circuit, 6T2C pixel circuit, 7T2C pixel circuit, 8T1C pixel circuit, or 8T2C pixel circuit.

Second Embodiment

Figure 6:
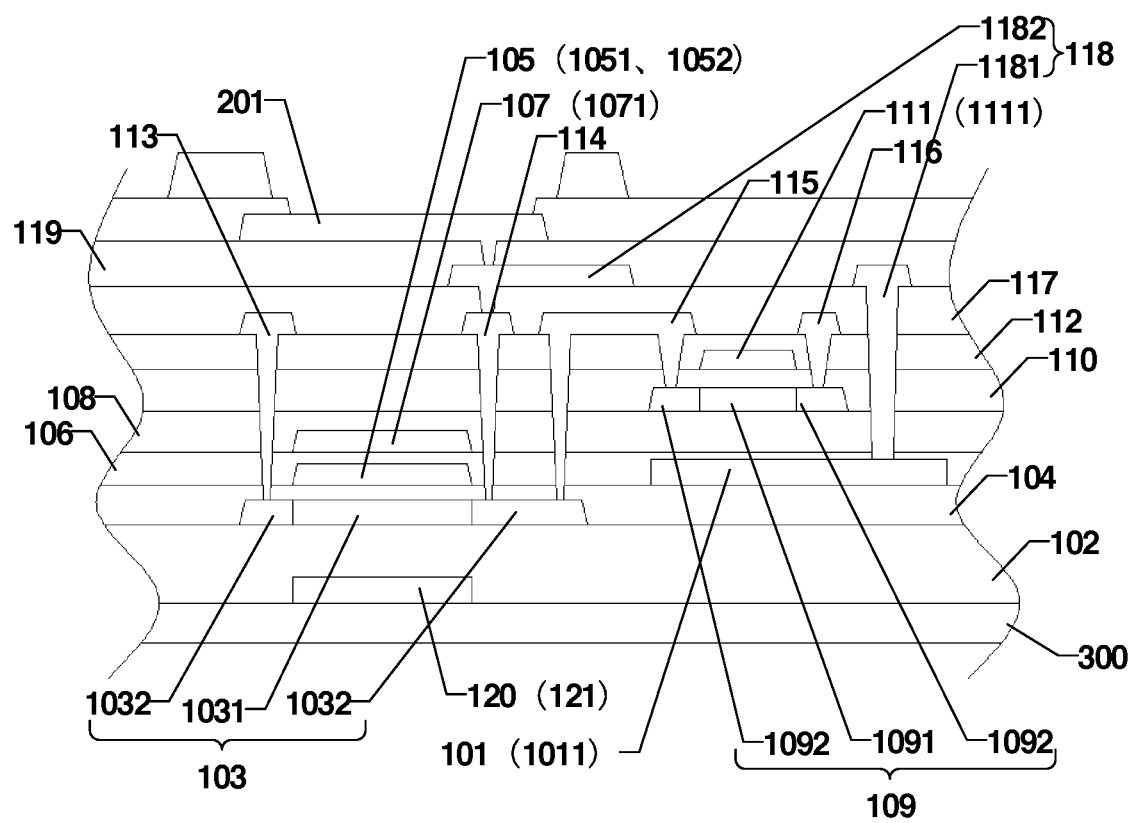
FIG. 6 is a schematic structural view of a display panel of a second embodiment of the present invention.

With reference to FIG. 6, the present embodiment comprises most features of the first embodiment, and a difference of the present embodiment from the first embodiment is that in the present embodiment, the second metal layer 101 and the fifth metal layer 105 are disposed in the same layer. In particular, the first shielding portion 1011 and the second gate electrode 1051 are disposed in the same layer and have the same material. As such, the same mask can be used to manufacture and form the first shielding portion 1011 and the second gate electrode 1051, which can save the mask and lower the cost.

A gap is formed between the first shielding portion 1011 and the second gate electrode 1051 to prevent the first shielding portion 1011 from contacting the second gate electrode 1051 and causing a shorting phenomenon.

Third Embodiment

Figure 7:
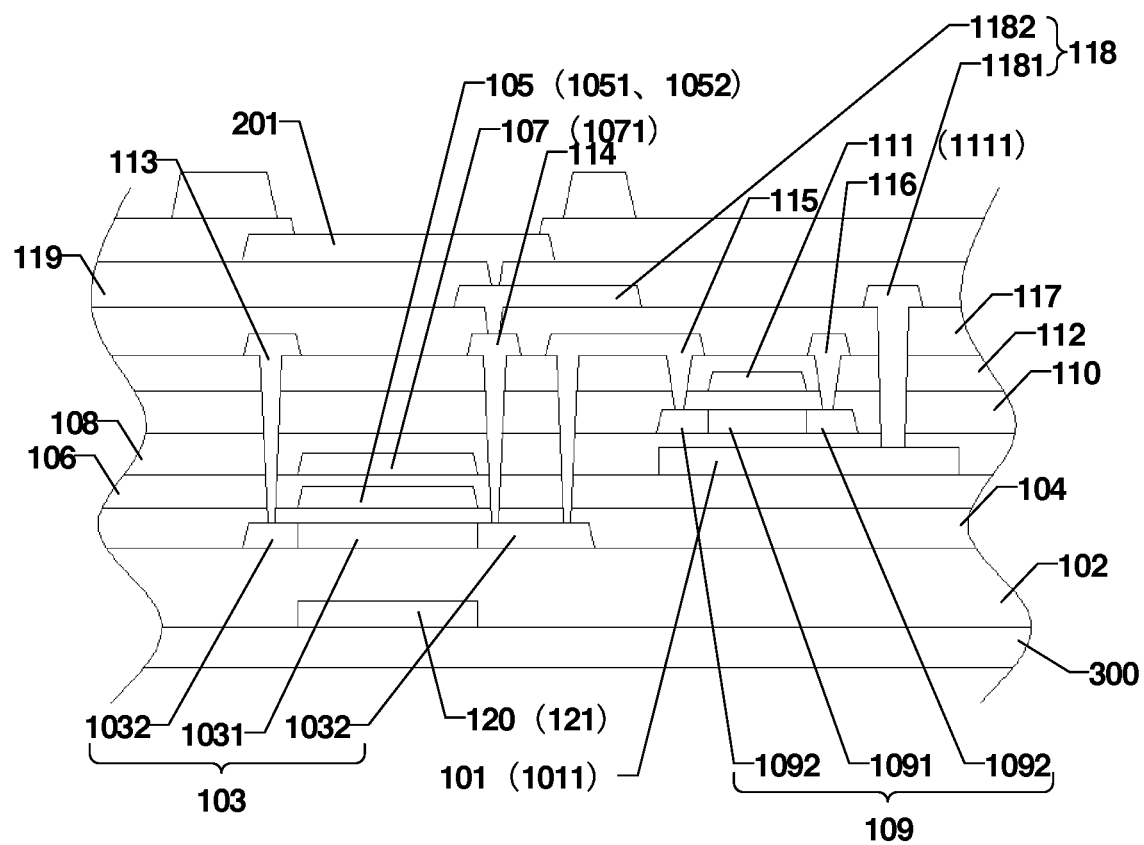
FIG. 7 is a schematic structural view of a display panel of a third embodiment of the present invention.

With reference to FIG. 7, the present embodiment comprises most features of the first embodiment, and a difference of the present embodiment from the first embodiment is that in the present embodiment, the second metal layer 101 and the sixth metal layer 107 are disposed in the same layer. In particular, the first shielding portion 1011 and the second capacitor electrode plate 1071 are disposed in the same layer and have the same material. The same mask can be used to manufacture and form the first shielding portion 1011 and the second capacitor electrode plate 1071, which can save the mask and lower the cost.

A gap is formed between the first shielding portion 1011 and the second capacitor electrode plate 1071 to prevent the first shielding portion 1011 from contacting the second capacitor electrode plate 1071 and causing a shorting phenomenon.

The display panel and the display device provided by the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. A display panel, comprising:
a substrate;
a first semiconductor layer disposed on a side of the substrate;
a second semiconductor layer disposed on a side of the first semiconductor layer away from the substrate, wherein material of the second semiconductor layer is metal oxide;
a first metal layer disposed on a side of the second semiconductor layer away from the substrate, wherein the first metal layer comprises a first gate electrode disposed to correspond to the second semiconductor layer;
a second metal layer disposed between the second semiconductor layer and the substrate, wherein the second metal layer comprises a first shielding portion disposed opposite to the second semiconductor layer, and the first shielding portion is fed to a first constant electric potential; and
a third metal layer disposed between the first semiconductor layer and the substrate, wherein the third metal layer comprises a second shielding portion disposed opposite to the first semiconductor layer to conduct a second constant electric potential.

2. The display panel according to claim 1, further comprising: a display region and a non-display region surrounding the display region;
wherein the display panel further comprises:
a fourth metal layer disposed on a side of the first metal layer away from the substrate, wherein the fourth metal layer comprises a first wiring disposed in the display region and the non-display region to conduct the first constant electric potential;
wherein the first shielding portion is electrically connected to the first wiring through a first via hole in the display region.

3. The display panel according to claim 2, wherein the fourth metal layer further comprises a second wiring disposed in the non-display region to conduct the second constant electric potential;
wherein the third metal layer comprises a plurality of second shielding portions disposed in the display region, adjacent ones of the second shielding portions are electrically connected to each other, and the second shielding portions are electrically connected to the second wiring through second via holes.

4. The display panel according to claim 3, wherein the display panel further comprises:
- a fifth metal layer disposed between the first semiconductor layer and the second semiconductor layer, wherein the fifth metal layer comprises a second gate electrode and a first capacitor electrode plate disposed to correspond to the first semiconductor layer; and
- a sixth metal layer disposed between the fifth metal layer and the second semiconductor layer, wherein the sixth metal layer further comprises a second capacitor electrode plate disposed to correspond to the first capacitor electrode plate.

5. The display panel according to claim 4, wherein the second metal layer and the fifth metal layer or the sixth metal layer are disposed in the same layer.

6. The display panel according to claim 2, wherein the third metal layer and the second metal layer are disposed in the same layer, and the first shielding portion is electrically connected to an adjacent one of the second shielding portions.

7. The display panel according to claim 1, wherein each of the first constant electric potential and the second constant electric potential are supplied from a high voltage power line.

8. The display panel according to claim 1, further comprising: a first thin film transistor, a second thin film transistor, a third thin film transistor, a fourth thin film transistor, a fifth thin film transistor, a sixth thin film transistor, a seventh thin film transistor, a first scan line, a second scan line, a third scan line, a fourth scan line; a data line, and a first light emitting control signal line; and the reset signal line comprises a first reset signal line and a second reset signal line;
- a source electrode of the first thin film transistor is electrically connected to the high voltage power line, and a drain electrode of the first thin film transistor is electrically connected to the low voltage power line;
- a source electrode of the second thin film transistor is electrically connected to a source electrode of the first thin film transistor, a drain electrode of the second thin film transistor is electrically connected to the data line, and a gate electrode drain electrode of the second thin film transistor is electrically connected to the first scan line;
- a source electrode of the third thin film transistor is electrically connected to a first drain electrode of the first thin film transistor, a drain electrode of the third thin film transistor is electrically connected to the gate electrode of the first thin film transistor, and a gate electrode of the third thin film transistor is electrically connected to the second scan line;
- a source electrode of the fourth thin film transistor is electrically connected to the gate electrode of the first thin film transistor, a drain electrode of the fourth thin film transistor is electrically connected to the first reset signal line, and a gate electrode of the fourth thin film transistor is electrically connected to the third scan line;
- a gate electrode of the fifth thin film transistor is electrically connected to the first light emitting control signal line, a source electrode of the fifth thin film transistor is electrically connected to a source electrode of the first thin film transistor, and a drain electrode of the fifth thin film transistor is electrically connected to the high power voltage line;
- a gate electrode of the sixth thin film transistor is electrically connected to the first light emitting control signal line, a source electrode of the sixth thin film transistor is electrically connected to a drain electrode of the first thin film transistor, and a drain electrode of the sixth thin film transistor is electrically connected to the low power voltage line;
- a source electrode of the seventh thin film transistor is electrically connected to a drain electrode of the sixth thin film transistor, a drain electrode of the seventh thin film transistor is electrically connected to the second reset signal line, and a gate electrode of the seventh thin film transistor is electrically connected to the fourth scan line;
- a first end of the storage capacitor is electrically connected to a gate electrode of the first thin film transistor, and a second end of the storage capacitor is electrically connected to a drain electrode of the fifth thin film transistor;
- wherein the third thin film transistor comprises the first shielding portion, the first shielding portion is electrically connected to the first constant electric potential;
- wherein the fourth thin film transistor comprises the first shielding portion, the first shielding portion is electrically connected to the first constant electric potential; and
- wherein the first thin film transistor comprises the second shielding portions, the second shielding portions are electrically connected to the second constant electric potential.

9. The display panel according to claim 8, wherein each of the third thin film transistor and the fourth thin film transistor comprises the second semiconductor layer, and material of the second semiconductor layer comprises metal oxide; and
- the first thin film transistor comprises the first semiconductor layer, material of the first semiconductor layer comprises a low-temperature poly-silicon semiconductor.

10. A display device, comprising a display panel, wherein the display panel comprises:
- a substrate;
- a first semiconductor layer disposed on a side of the substrate;
- a second semiconductor layer disposed on a side of the first semiconductor layer away from the substrate, wherein material of the second semiconductor layer comprises metal oxide;
- a first metal layer disposed on a side of the second semiconductor layer away from the substrate, wherein the first metal layer comprises a first gate electrode disposed to correspond to the second semiconductor layer;
- a second metal layer disposed between the second semiconductor layer and the substrate, wherein the second metal layer comprises a first shielding portion disposed opposite to the second semiconductor layer, and the first shielding portion is fed to a first constant electric potential; and
- a third metal layer disposed between the first semiconductor layer and the substrate, wherein the third metal layer comprises a second shielding portion disposed opposite to the first semiconductor layer, and the second shielding portion is electrically connected to a second constant electric potential.

11. The display device according to claim 10, wherein the display panel comprises: a display region and a non-display region surrounding the display region;
the display panel further comprises:

a fourth metal layer disposed on a side of the first metal layer away from the substrate, wherein the fourth metal layer comprises a first wiring disposed in the display region and the non-display region to conduct the first constant electric potential;

wherein the first shielding portion is electrically connected to the first wiring through a first via hole in the display region.

12. The display device according to claim 11, wherein the fourth metal layer further comprises a second wiring disposed in the non-display region to conduct the second constant electric potential;

wherein the third metal layer comprises a plurality of second shielding portions disposed in the display region, adjacent ones of the second shielding portions are electrically connected to each other, and the second shielding portions are electrically connected to the second wiring through second via holes.

13. The display device according to claim 12, wherein the display panel further comprises:

a fifth metal layer disposed between the first semiconductor layer and the second semiconductor layer, wherein the fifth metal layer comprises a second gate electrode and a first capacitor electrode plate disposed to correspond to the first semiconductor layer; and a sixth metal layer disposed between the fifth metal layer and the second semiconductor layer, wherein the sixth metal layer further comprises a second capacitor electrode plate disposed to correspond to the first capacitor electrode plate.

14. The display device according to claim 13, wherein the second metal layer and the fifth metal layer or the sixth metal layer are disposed in the same layer.

15. The display device according to claim 11, wherein the third metal layer and the second metal layer are disposed in the same layer, and the first shielding portion is electrically connected to an adjacent one of the second shielding portions.

16. The display device according to claim 10, wherein each of the first constant electric potential and the second constant electric potential are supplied from a high voltage power line.

17. The display device according to claim 10, wherein the display panel further comprises: a first thin film transistor, a second thin film transistor, a third thin film transistor, a fourth thin film transistor, a fifth thin film transistor, a sixth thin film transistor, a seventh thin film transistor, a first scan line, a second scan line, a third scan line, a fourth scan line; a data line, and a first light emitting control signal line; and the reset signal line comprises a first reset signal line and a second reset signal line;

a source electrode of the first thin film transistor is electrically connected to the high voltage power line, and a drain electrode of the first thin film transistor is electrically connected to the low voltage power line;

a source electrode of the second thin film transistor is electrically connected to a source electrode of the first thin film transistor, a drain electrode of the second thin film transistor is electrically connected to the data line, and a gate electrode drain electrode of the second thin film transistor is electrically connected to the first scan line;

a source electrode of the third thin film transistor is electrically connected to a first drain electrode of the first thin film transistor, a drain electrode of the third thin film transistor is electrically connected to the gate electrode of the first thin film transistor, and a gate electrode of the third thin film transistor is electrically connected to the second scan line;

a source electrode of the fourth thin film transistor is electrically connected to the gate electrode of the first thin film transistor, a drain electrode of the fourth thin film transistor is electrically connected to the first reset signal line, and a gate electrode of the fourth thin film transistor is electrically connected to the third scan line;

a gate electrode of the fifth thin film transistor is electrically connected to the first light emitting control signal line, a source electrode of the fifth thin film transistor is electrically connected to a source electrode of the first thin film transistor, and a drain electrode of the fifth thin film transistor is electrically connected to the high power voltage line;

a gate electrode of the sixth thin film transistor is electrically connected to the first light emitting control signal line, a source electrode of the sixth thin film transistor is electrically connected to a drain electrode of the first thin film transistor, and a drain electrode of the sixth thin film transistor is electrically connected to the low power voltage line;

a source electrode of the seventh thin film transistor is electrically connected to a drain electrode of the sixth thin film transistor, a drain electrode of the seventh thin film transistor is electrically connected to the second reset signal line, and a gate electrode of the seventh thin film transistor is electrically connected to the fourth scan line;

a first end of the storage capacitor is electrically connected to a gate electrode of the first thin film transistor, and a second end of the storage capacitor is electrically connected to a drain electrode of the fifth thin film transistor;

wherein the third thin film transistor comprises the first shielding portion, the first shielding portion is electrically connected to the first constant electric potential;

wherein the fourth thin film transistor comprises the first shielding portion, the first shielding portion is electrically connected to the first constant electric potential; and wherein the first thin film transistor comprises the second shielding portions, the second shielding portions are electrically connected to the second constant electric potential.

18. The display device according to claim 17, each of the third thin film transistor and the fourth thin film transistor comprises the second semiconductor layer, and material of the second semiconductor layer comprises metal oxide; and the first thin film transistor comprises the first semiconductor layer, material of the first semiconductor layer comprises a low-temperature poly-silicon semiconductor.

* * * * *